United States Patent
Lu et al.

(10) Patent No.: US 7,448,395 B2
(45) Date of Patent: Nov. 11, 2008

(54) PROCESS METHOD TO FACILITATE SILICIDATION

(75) Inventors: Jiong-Ping Lu, Richardson, TX (US); Freidoon Mehrad, Plano, TX (US); Lindsey Hall, Plano, TX (US); Vivian Liu, Garland, TX (US); Clint Montgomery, Coppell, TX (US); Scott Johnson, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 59 days.

(21) Appl. No.: 10/894,374

(22) Filed: Jul. 19, 2004

(65) Prior Publication Data

US 2006/0014393 A1 Jan. 19, 2006

(51) Int. Cl.
*B08B 6/00* (2006.01)
*C25F 1/00* (2006.01)
*C25F 3/30* (2006.01)
*C25F 5/00* (2006.01)

(52) U.S. Cl. ......................... 134/1.3; 257/382; 257/769
(58) Field of Classification Search ................. 257/382, 257/769; 134/1.3
See application file for complete search history.

(56) References Cited

U.S. PATENT DOCUMENTS 6,323,519 B1 * 11/2001 Gardner et al. .............. 257/336
6,725,119 B1 * 4/2004 Wake ......................... 700/121
6,743,721 B2 6/2004 Lur et al.
2002/0157686 A1 * 10/2002 Kenny et al. ................. 134/1.3
2004/0058500 A1 3/2004 Lee et al.
2004/0201066 A1 * 10/2004 Han ............................ 257/382

* cited by examiner

*Primary Examiner*—Duy-Vu N Deo
(74) *Attorney, Agent, or Firm*—Jacqueline J. Garner; W. James Brady, III; Frederick J. Telecky, Jr.

(57) ABSTRACT

The present invention substantially removes dry etch residue from a dry plasma etch process 110 prior to depositing a cobalt layer 124 on silicon substrate and/or polysilicon material. Subsequently, one or more annealing processes 128 are performed that cause the cobalt to react with the silicon thereby forming cobalt silicide regions. The lack of dry etch residue remaining between the deposited cobalt and the underlying silicon permits the cobalt silicide regions to be formed substantially uniform with a desired silicide sheet and contact resistance. The dry etch residue is substantially removed by performing a first cleaning operation 112 and then an extended cleaning operation 114 that includes a suitable cleaning solution. The first cleaning operation typically removes some, but not all of the dry etch residue. The extended cleaning operation 114 is performed at a higher temperature and/or for an extended duration and substantially removes dry etch residue remaining after the first cleaning operation 112.

14 Claims, 5 Drawing Sheets

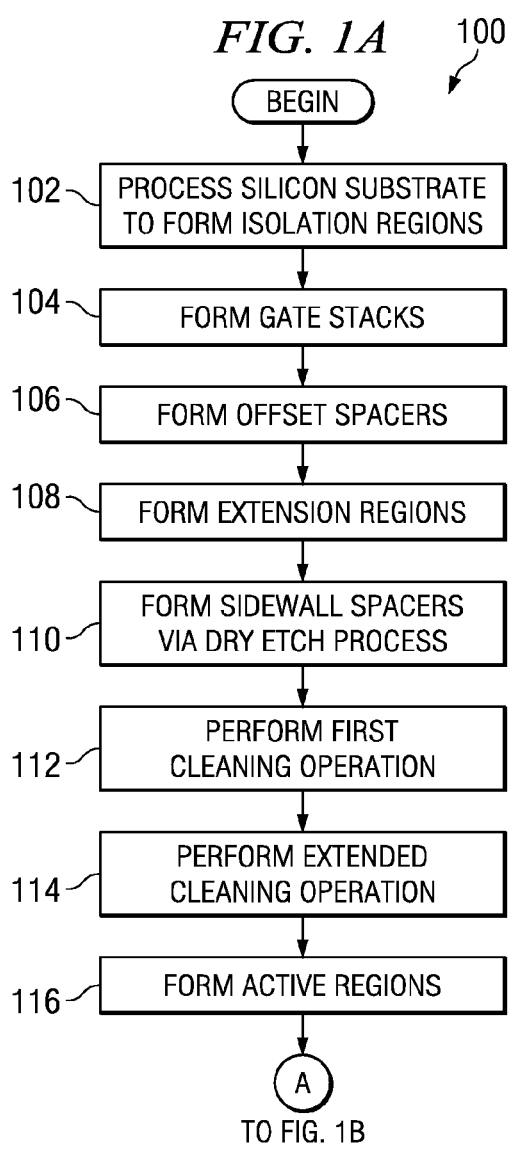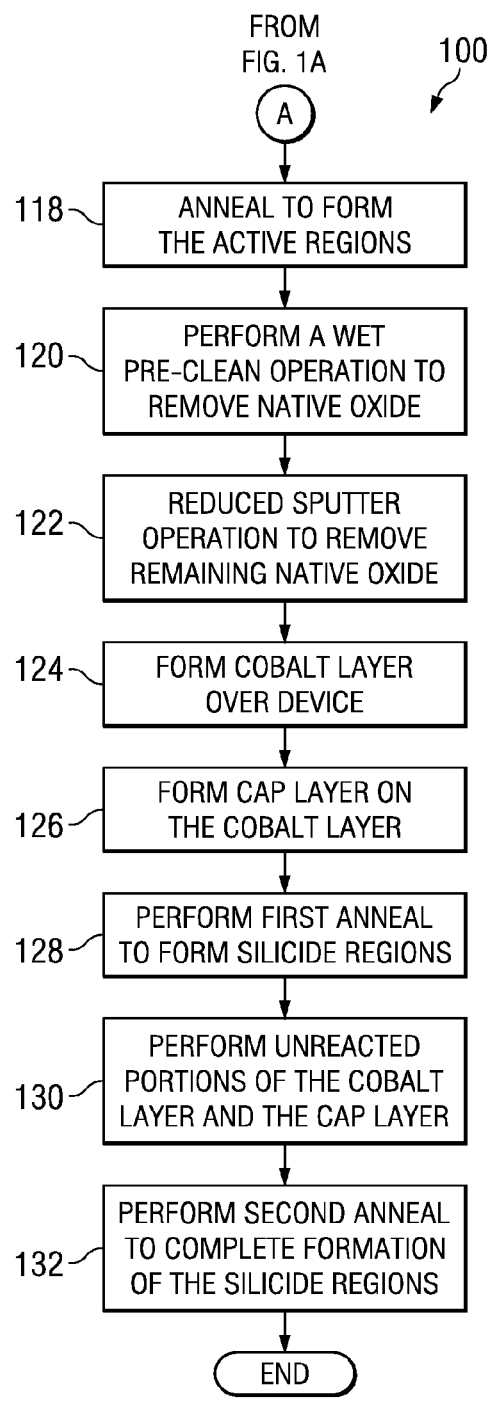

US 7,448,395 B2

PROCESS METHOD TO FACILITATE SILICIDATION

FIELD OF THE INVENTION

The present invention relates generally to semiconductor devices, and more particularly, to systems and methods to facilitate silicidation during semiconductor device fabrication.

BACKGROUND OF THE INVENTION

Semiconductor devices such as, complementary metal oxide semiconductor (CMOS) devices, make extensive use of interconnects and contacts that should be scaleable to allow smooth migration to smaller geometries. Connections to and between active CMOS FET devices are typically created with "silicide" regions wherein a portion of a source/drain region is converted during a thermal treatment into a metallic low resistance region.

Silicide regions are typically formed on active regions and on poly gates. Generally, silicide regions are formed by depositing a refractory metal, such as Titanium (Ti), on the active regions and gates. Heat is applied and the refractory metal reacts with the underlying polysilicon and/or silicon layers by an alloy step forming silicide. Unreacted refractory metal is then removed from the surface of the device. The formed silicide regions provide low resistance regions that can be contacted by metal/conductive interconnects typically formed later.

A common mechanism to form silicide regions involves utilizing Titanium (Ti) as a refractory metal to react with Silicon (Si) to form Titanium-silicide ($TiSi_2$) on gate and active regions. However, $TiSi_2$ has several limitations including, but not limited to, line-width dependent sheet resistance and bridging effect that causes high leakage current.

Another mechanism to form silicide regions employs Cobalt (Co) as a refractory metal to react with Silicon to form Cobalt-silicide ($CoSi_2$). An advantage of $CoSi_2$ over $TiSi_2$ is the extendibility of $CoSi_2$ to smaller CMOS devices. However, formation of Cobalt-silicide can be problematic. For example, cobalt is sensitive to oxygen and water. As a result, formed Cobalt salicide (self aligned silicide) can be contaminated with oxygen and/or water, thereby increasing sheet resistance of the formed Cobalt salicide even if relatively pure inert gas is employed for the heat treatment. One technique employed to reduce this oxidation of cobalt salicide is to form a Titanium (Ti) and/or a Titanium-nitride (TiN) cap layer on top of deposited cobalt prior to its reaction with underlying silicon and/or polysilicon.

Typically, a cobalt layer is deposited on/over a wafer having a top surface comprised of a mixture of exposed surfaces including dielectric surfaces and silicon surfaces. A Ti or TiN cap layer is deposited on the Co layer without exposing the cobalt layer to air. Subsequently, the wafer is subjected to a first annealing process during which the cobalt reacts with silicon at the surface of the wafer where silicon or polysilicon is in contact with the cobalt layer. After the first anneal, the wafer is etched in a $NH_4OH$, $H_2O_2$, $H_2O$ solution and then with a $H_2SO_4$, $H_2O_2$, $H_2O$ solution. This two-step wet etch process attempts to remove un-reacted cobalt and Ti or TiN. Then, a second anneal is performed to complete the cobalt salicide formation process.

The use of a Ti cap layer has been shown to mitigate oxygen contamination. However, other problems can result from the inclusion of the Ti cap layer in the salicide formation process. For example, Ti can diffuse into the cobalt layer during the first anneal, resulting in mediation of the silicidation reaction by Ti. Thus, the presence of Ti retards the cobalt-silicon reaction so that higher anneal temperatures may be required to complete the reaction. Additionally, some of the Ti can react with cobalt forming an unwanted CoTi inter-metallic mixture layer that causes high sheet resistance. Additionally, the presence of Ti and/or TiN can reduce the amount of cobalt available to react with underlying silicon.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to the more detailed description that is presented later.

The present invention facilitates cobalt silicide region formation in semiconductor devices. As a result, desired resistances for formed cobalt silicide regions can be obtained, even for relatively small sized semiconductor devices.

The present invention substantially removes dry etch residue from a dry plasma etch process prior to depositing a cobalt layer on a silicon substrate and/or polysilicon material. Subsequently, one or more annealing processes are performed that cause the cobalt to react with the clean silicon surface, thereby forming cobalt silicide regions. The lack of dry etch residue remaining between the deposited cobalt and the underlying silicon permits the cobalt silicide regions to be formed substantially uniform with a desired resistance.

The dry etch residue is substantially removed by performing a first cleaning operation and then an extended cleaning operation that includes a suitable cleaning solution. The first cleaning operation typically removes some, but not all of the dry etch residue. The extended cleaning operation is performed at a higher temperature and/or for an extended duration and substantially removes dry etch residue remaining after the first cleaning operation.

This extended clean is performed immediately after the dry plasma etch and prior to the heavy source/drain implants. To the accomplishment of the foregoing and related ends, the invention comprises the features hereinafter fully described and particularly pointed out in the claims. The following description and the annexed drawings set forth in detail certain illustrative aspects and implementations of the invention. These are indicative, however, of but a few of the various ways in which the principles of the invention may be employed. Other objects, advantages and novel features of the invention will become apparent from the following detailed description of the invention when considered in conjunction with the drawings.

BRIEF DESCRIPTION OF THE DRAWINGS

FIGS. 1A and 1B are a flow diagram illustrating a method of fabricating a semiconductor device in accordance with an aspect of the present invention.

DETAILED DESCRIPTION OF THE INVENTION

Figure 2A:
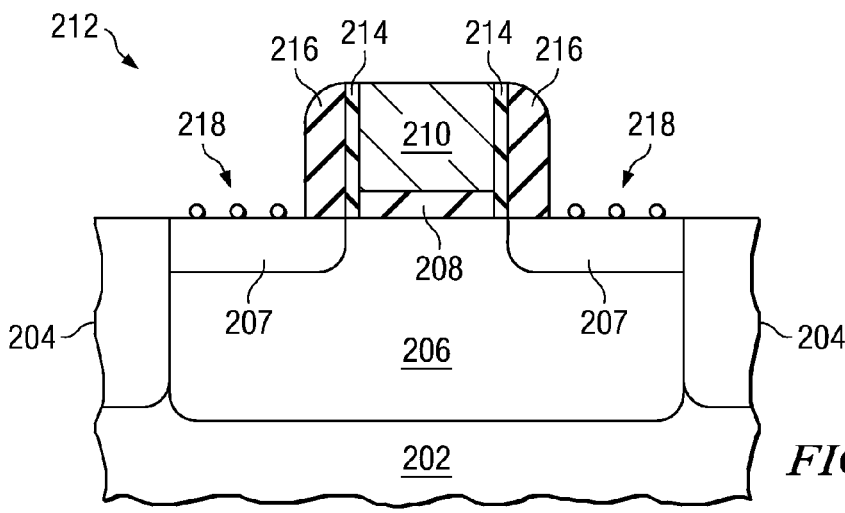
FIG. 2A is a cross sectional view of an exemplary semiconductor device after etching with a dry etch plasma etch process in accordance with an aspect of the present invention.

The present invention will now be described with respect to the accompanying drawings in which like numbered elements represent like parts. The figures provided herewith and the accompanying description of the figures are merely provided for illustrative purposes. One of ordinary skill in the art should realize, based on the instant description, other implementations and methods for fabricating the devices and structures illustrated in the figures and in the following description.

The present invention substantially removes dry etch residue resulting from a dry plasma etch process prior to depositing a cobalt layer on a silicon substrate and/or polysilicon material. Subsequently, one or more annealing processes are performed that cause the cobalt to react with the silicon thereby forming cobalt silicide regions. The lack of dry etch residue remaining between the deposited cobalt and the underlying silicon permits the cobalt silicide regions to be formed substantially uniformly and with a desired contact resistance, particularly for reduced contact pitch semiconductor devices.

FIG. 1 is a flow diagram illustrating a method 100 of fabricating a semiconductor device in accordance with an aspect of the present invention. The method 100 mitigates contamination of cobalt during silicidation by employing an additional cleaning operation that removes residue. By mitigating contamination, a more uniform cobalt silicide contact/region can be formed, particularly for devices with relatively small contact to poly spacing of 200 nm or less pitches.

FIGS. 2A through 2H are provided and described below to illustrate an exemplary semiconductor device 200 fabricated by way of the method 100 of FIG. 1. The FIGS. 2A through 2H serve to further illustrate the method 100 by depicting exemplary layers as they are formed during the method 100. However, it is appreciated that substantial variations in structure and composition can occur in semiconductor device formed from the method 100 and variations thereof and yet be in accordance with the present invention.

The method 100 begins at block 102 wherein a silicon or semiconductor substrate or body is processed to form isolation regions (e.g., shallow trench isolation regions (STI)). Then, wells are defined and can be doped by selectively implanting desired dopants to form n-type and/or p-type well regions.

Gate stacks are formed at block 104 by depositing a gate oxide or insulating layer on the semiconductor substrate, forming a polysilicon or conductive layer on the gate oxide layer, and patterning the gate oxide layer and the polysilicon layer to form the gate stacks. The polysilicon layer can also be lightly doped (n-type or p-type) in order to facilitate operation of the device.

Offset spacers are formed adjacent the sidewalls of the gate structures at block 106. The offset spacers are typically formed by depositing or growing a dielectric layer (e.g., oxide) and etching the deposited dielectric layer to leave the formed offset spacers. Extension regions are then formed at block 108 by performing shallow implants at relatively low energies with selected dopants to form the extension regions.

Continuing with the method 100, sidewall spacers are formed at block 110 by depositing a sidewall dielectric layer and etching the dielectric layer via a dry etch plasma process to form the sidewall spacers adjacent to the gate stacks and the offset spacers. It is appreciated that formation of the sidewall spacers can include depositing multiple dielectric layers of varied dielectric materials prior to patterning the multiple dielectric layers. Dry etch plasma processes are chemical processes that use gas and plasma energy to cause the desired chemical reactions. The dry etch plasma processes employ a chemical etchant and an energy source.

Dry etch plasma processes are performed within a chamber and typically include a vacuum system, gas supply, and a power supply. The semiconductor device (along with other semiconductor device or wafers) are loaded into the chamber and the pressure inside is reduced by the vacuum system. After the vacuum is established, the chamber is filled with a reactive gas selected for the target material (e.g., $CF_4$ mixed with oxygen for silicon dioxide). A power supply creates a radio frequency (RF) field through electrodes in the chamber, which energizes the reactive gas to a plasma state. In the energized, plasma state, ions (e.g., fluorine) attack the target material (e.g., silicon dioxide) converting the target material into volatile components that are removed by the vacuum system. An undesired result of the dry etch plasma process employed to form the sidewall spacers is that dry etch residue from the reactant gas, target material, and volatile components can remain on surfaces of the semiconductor device.

The inventors of the present invention have identified that this dry etch residue can negatively impact and/or prevent cobalt silicide formation and, therefore, result in an undesired increase in resistance in silicon and poly gate.

FIG. 2A is a cross sectional view of an exemplary semiconductor device 200 after etching with a dry etch plasma etch process in accordance with an aspect of the present invention. The exemplary device 200 is fabricated via block 102 to 110 of the method 100 of FIG. 1. Isolation regions 204 are formed in a semiconductor substrate or body 202 and define, for example, a well region 206 that can be doped n-type or p-type. A gate oxide layer or other insulating layer 208 is formed on the well region 206 and a polysilicon layer or other gate electrode 210 is formed on the gate oxide layer 208. The gate oxide layer 208 and the polysilicon layer 210 have been dry etched to define a gate stack 212. Offset spacers 214 are formed on sidewalls of the gate stack 212 and are employed to form extension regions 207. Sidewall spacers 216 are formed adjacent the offset spacers 214 by depositing a dielectric layer and patterning the dielectric layer with a dry etch plasma process. Dry etch residue 218 can be present on surfaces of the extension regions 207 and/or the polysilicon layer 210.

Referring again to FIG. 1A, a first cleaning operation is performed at block 112 by cleaning a surface of the semiconductor device with a mixture, for example, of ammonium hydroxide and peroxide ($NH_4OH$—$H_2O_2$—$H_2O$) having a ratio, for example, of 1:1:5. The first cleaning operation is typically performed at a temperature of about 25 to 60 degrees Celsius for a duration of about 3.5 minutes to 10 minutes via a bath or a spray processor. However, it is appreciated that other temperatures and durations can be employed such as, for example, a temperature of 60 degrees Celsius and a duration of 5 minutes in a bath, a temperature of 25 degrees Celsius and a duration of 10 minutes in a bath, a temperature of 60 degrees Celsius and a duration of 3.5 minutes in a spray processor, and the like. The first cleaning operation removes some, but typically not all, of the remaining dry etch residue.

The inventors of the present invention have identified that the remaining dry etch residue after the first cleaning operation can be present and can degrade or prevent proper cobalt silicide formation. The remaining dry etch residue, if not removed, can prevent cobalt and underlying silicon from reacting. As a result, cobalt silicide regions can be improperly formed leading to an undesirable increase in silicide sheet and also contact resistance.

Figure 2B:
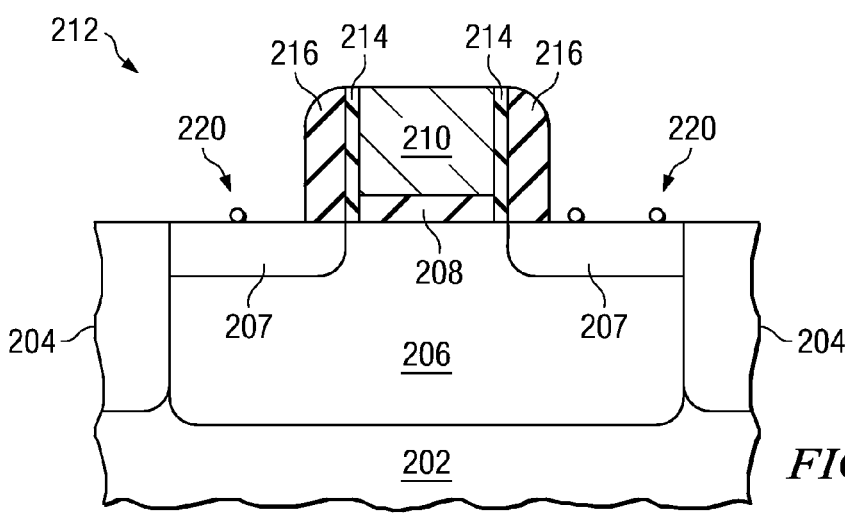
FIG. 2B is a cross sectional view of an exemplary semiconductor device after performing a first cleaning operation in accordance with an aspect of the present invention.

FIG. 2B is a cross sectional view of an exemplary semiconductor device 200 after performing a first cleaning operation in accordance with an aspect of the present invention. Even after the first cleaning operation, some of the dry etch residue 220 can remain on surface portions of the extension regions 207 and/or the polysilicon layer 210.

An extended cleaning operation is performed at block 114 in order to substantially remove the remaining dry etch residue. As described above, the first cleaning operation 112 typically fails to remove all of the residue from the dry etch employed to form the sidewall spacers. The extended cleaning operation substantially removes any remaining dry etch residue.

The semiconductor device and the wafer the device is formed upon are immersed in the cleaning solution, typically along with other wafers as a batch immersion process. However, other suitable operations include single wafer processing and/or spraying the cleaning solution onto surfaces of the device and wafer. Subsequently, a suitable drying operation is performed to dry the device and wafer, such as, for example a spin dry.

One exemplary suitable extending cleaning operation employs a cleaning solution comprised of ammonium hydroxide and peroxide ($NH_4OH$—$H_2O_2$—$H_2O$) and performs the cleaning operation for an extended period of time and/or at a relatively high temperature. The ammonium hydroxide and peroxide cleaning operation is performed for a duration greater than or equal to about 5-20 minutes and is performed at a temperature of 50-70 degrees Celsius. Additionally, the ammonium hydroxide and peroxide is generally more diluted than that employed in the first cleaning operation. As an example, a suitable mixture of ammonium hydroxide and peroxide employed for the cleaning solution has a ratio for $NH_4OH:H_2O_2:H_2O$ of about 1:1:20. The inventors of the present invention appreciate that the extended period of time and/or temperature can require a more diluted solution of ammonium hydroxide and peroxide.

Another suitable extended cleaning operation employs a cleaning solution comprised of $H_3PO_4$. With this solution, an even higher temperature is employed (e.g., about 120 degrees Celsius) for the extended duration (e.g., greater than about 10 minutes).

Figure 2C:
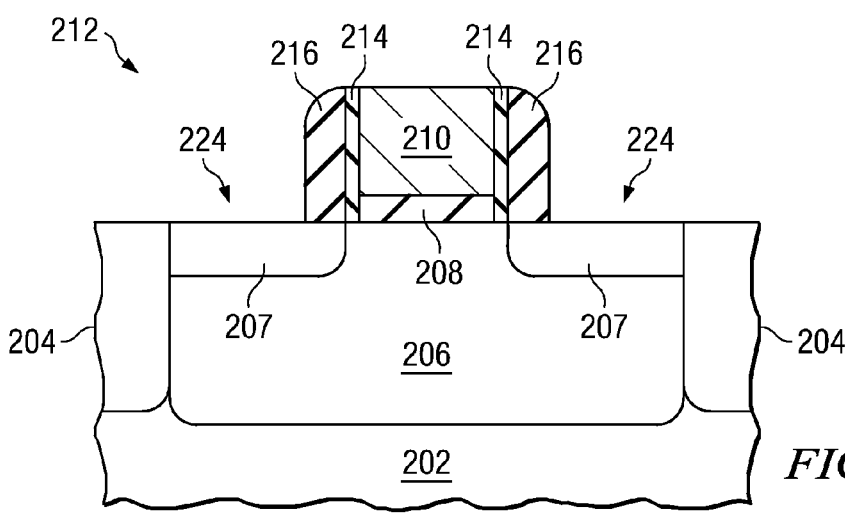
FIG. 2C is a cross section view of an exemplary semiconductor device after performing an extended cleaning operation in accordance with an aspect of the present invention.

FIG. 2C is a cross section view of an exemplary semiconductor device 200 after performing an extended cleaning operation in accordance with an aspect of the present invention. The extended cleaning operation substantially removes any remaining dry etch residue.

Active regions (source and drain regions) are formed at block 116 by selectively implanting n-type and/or p-type dopants. The implantation is typically performed with a higher energy than employed in forming the extension regions such that the active regions are deeper than the extension regions but not as deep as the formed well regions. Subsequently, an annealing operation is performed at block 118 to facilitate formation of the active regions. In alternate aspects of the invention, the first cleaning operation of block 112 and/or the extended cleaning operation of block 114 can be performed after implanting the n-type and/or p-type dopants at block 116, but before the annealing performed at block 118.

Figure 2D:
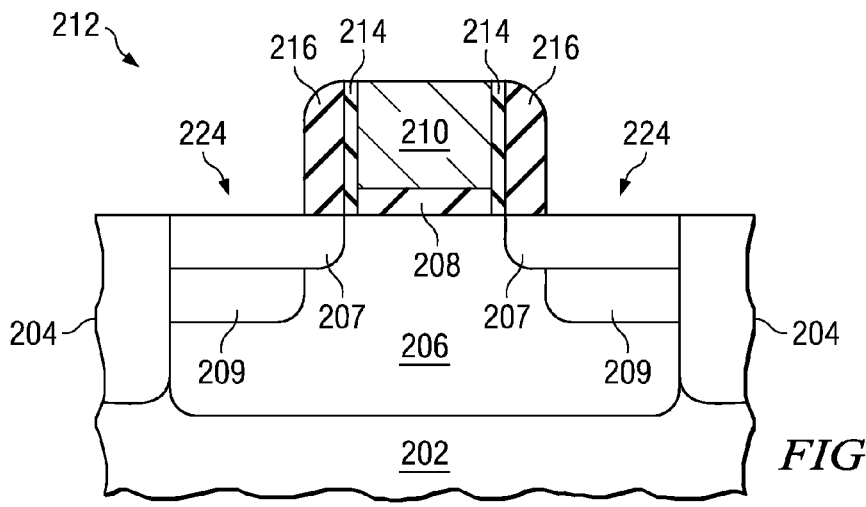
FIG. 2D is a cross sectional view of an exemplary semiconductor device after formation of active regions in accordance with an aspect of the present invention.

FIG. 2D is a cross sectional view of an exemplary semiconductor device 200 after formation of active regions 209 in accordance with an aspect of the present invention. The active regions 209 were formed and annealed as described in blocks 114 and 116 and extend below the extension regions 207.

Continuing with the method 100, a wet pre-clean operation is performed to remove native oxide from at least some surface portions of the active regions at block 120. An example of a suitable process for the wet pre-clean operation includes processing the semiconductor device in an HF dip using deoxygenated water. Then, isopropyl alcohol is employed to dry the device. The HF dip and the isopropyl drying can be performed repeatedly. Another example of a suitable process for the wet pre-clean operation includes using an HF vapor treatment to remove the native oxide.

Subsequent the wet pre-clean operation of block 120, a reduced argon pre-clean operation, also referred to as a pre-sputter etch (PSE), is performed at block 122 to remove remaining native oxide (not shown) left after the wet pre-clean operation performed at block 120. The reduced pre-clean operation is performed with a reduced amount of argon to mitigate removal of material from the sidewalls, which can result in sidewall residue depositing from the sidewalls and onto the surface portions of the active regions and the gate stack. In one example, the reduced pre-clean operation is performed with 20+/−10 A PETEOS equivalent oxide removal. Conventional argon based sputter etches remove 30 to 75 Angstroms of oxide. The reduced pre-clean operation removes less the 30 Angstroms (e.g., about 10 to 20 Angstroms). It is appreciated that other types of sputter etch can be performed in alternate aspects of the present invention. Furthermore, it is also appreciated that alternate aspects of the present invention can perform the method 100 without the sputter pre-clean operation of block 120. Additionally, the pre-cleaning operations of block 120 and 122 that remove the native oxide can in other aspects of the invention be performed prior to forming the active regions at block 116.

At block 124, cobalt is deposited over the device forming a layer of cobalt material. A number of suitable cobalt deposition techniques can be employed to form the cobalt layer. One such technique begins with placing the semiconductor device in a sputter deposition chamber wherein the cobalt material (e.g., about 10 nm) is deposited over the entire device using a substantially pure cobalt target in a noble gas plasma environment.

Figure 2E:
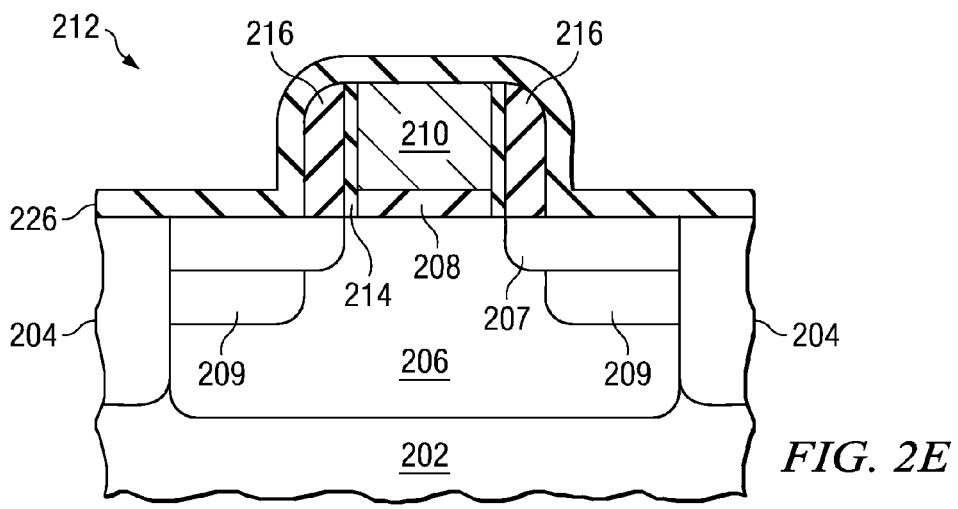
FIG. 2E is a cross sectional view of an exemplary semiconductor device after depositing a layer of cobalt on the device in accordance with an aspect of the present invention.

FIG. 2E is a cross sectional view of an exemplary semiconductor device 200 after depositing a layer of cobalt 226 on the device in accordance with an aspect of the present invention. The cobalt layer 226 is deposited in accordance with block 124 of the method 100 of FIG. 1. FIG. 2E indicates that the dry etch residue 224 of FIG. 2F has been substantially removed by the pre-cleaning operations of blocks 118 and 120. Additionally, the reduced sputter pre-clean operation of block 120 has not removed portions of the sidewalls 216 and/or deposited removed portions of the sidewalls 216 onto surface portions of the extension regions 207 and/or the polysilicon layer 210.

A cap layer is formed on the cobalt layer at block 126. The cap layer comprises a cap material such as Ti or TiN and serves to mitigate oxygen contamination of the cobalt layer. The cap layer is formed by depositing the cap material via a suitable deposition process. An example of such a process involves placing the device in a chamber wherein the cap material is deposited via, for example, PVD to form a TiN cap layer with a thickness of about 15 nm in a nitrogen gas environment.

Figure 2F:
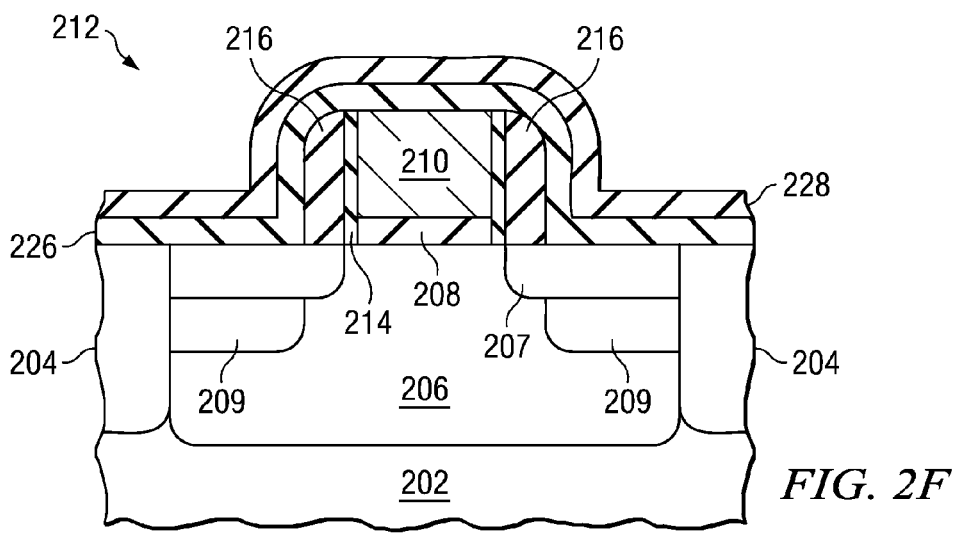
FIG. 2F is a cross sectional view of an exemplary semiconductor device after forming a cap layer in accordance with an aspect of the present invention.

FIG. 2F is a cross sectional view of an exemplary semiconductor device 200 after forming a cap layer 228 in accordance with an aspect of the present invention. The cap layer 228 is formed on the cobalt layer 226 and comprises a suitable material that may mitigate oxygen contamination of the cobalt layer 226. It is appreciated that other semiconductor devices fabricated in accordance with the present invention can forego forming and using a cap layer.

A first anneal process is performed at block 128 in order to initiate silicidation of cobalt and silicon thereby forming silicide regions. Typically, a rapid thermal process is typically performed for a duration of 10-100 Sec and at a temperature of 500-650 C.

Figure 2G:
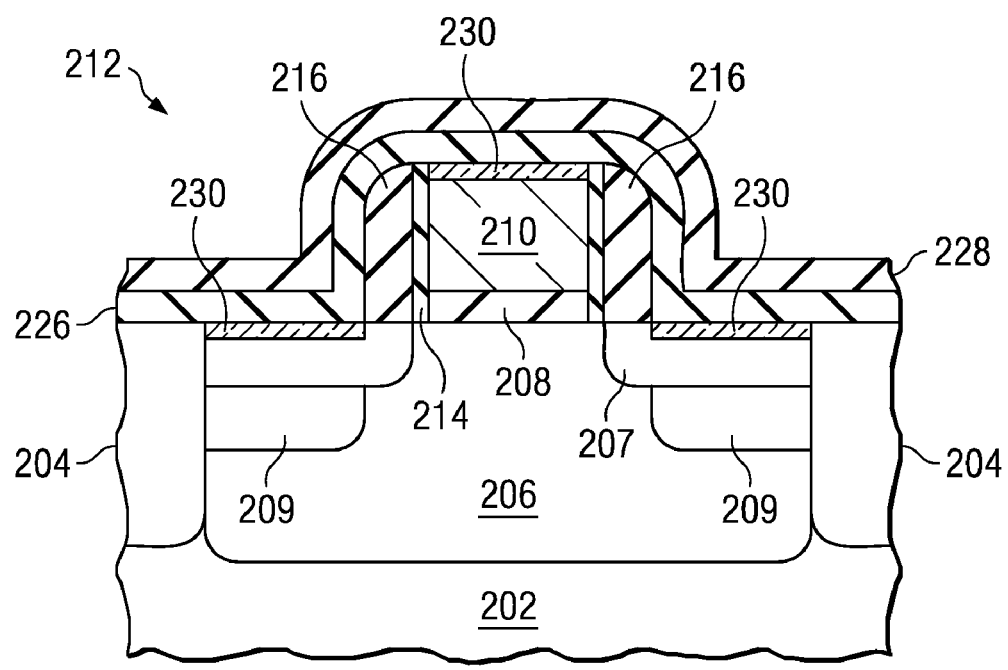
FIG. 2G is a cross sectional view of an exemplary semiconductor device after formation of silicide regions in accordance with an aspect of the present invention.

FIG. 2G is a cross sectional view of an exemplary semiconductor device 200 after formation of silicide regions 230 in accordance with an aspect of the present invention. The silicide regions 230 are formed as cobalt-silicide by a reaction between the deposited cobalt layer 226 and surface portions of the extension regions 207 (or active regions 209) and the polysilicon layer 210. Silicon and cobalt react under temperature to form the cobalt mono-silicide regions 230. The silicide regions 230 are formed as desired with substantial uniformity because contaminants such as the dry etch residue had been removed prior to depositing the cobalt layer 226.

Subsequent to formation of the silicide regions, remaining un-reacted portions of the cobalt layer are removed and the cap layer is removed at block 130. A suitable etch process, such as a two step wet etch process, is employed to remove the unreacted portions of the cobalt layer and the cap layer. The two step etch comprises etching the semiconductor device in a $NH_4OH$, $H_2O_2$, $H_2O$ solution followed by an etch in a $H_2SO_4$, $H_2O_2$, $H_2O$ solution. Subsequently, a second anneal process is performed at block 132 to complete formation of the silicide regions, which results in the formation of low resistance cobalt di-silicide. The second anneal process is also typically a rapid thermal anneal process performed at a temperature of 650-900 C for a duration of 10-60 Sec.

After formation of the silicide regions additional processing steps are typically performed to form additional layers and structures such as, for example, interlevel dielectric layers, metallization, and the like.

Figure 2H:
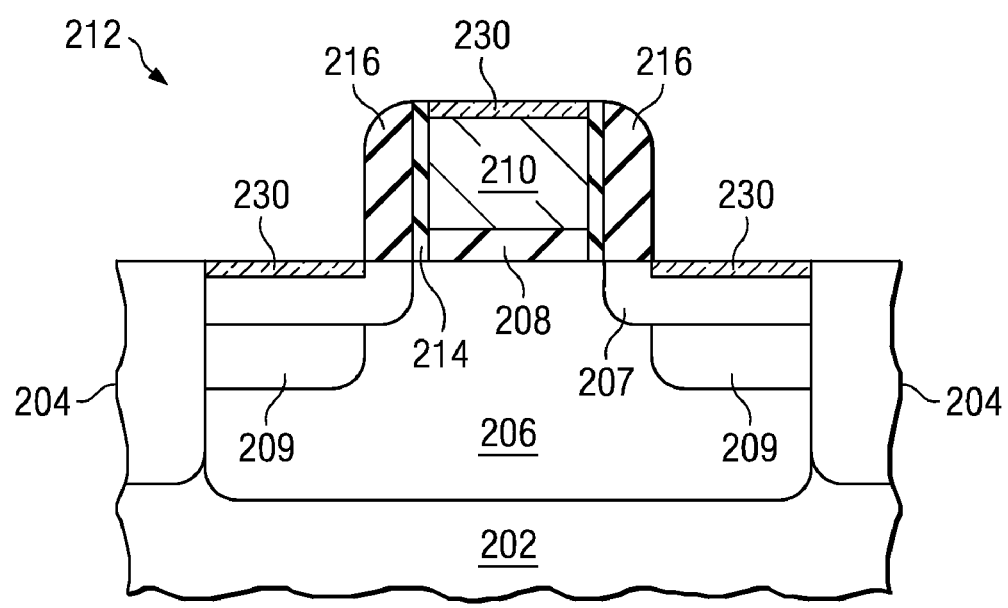
FIG. 2H is a cross sectional view of an exemplary semiconductor device after removal of the un-reacted cobalt layer and TiN layer in accordance with an aspect of the present invention.

FIG. 2H is a cross sectional view of an exemplary semiconductor device 200 after removal of the un-reacted cobalt layer 226 in accordance with an aspect of the present invention. The cobalt layer 226 and the cap layer 228 are removed as described at block 128 of the method 100 of FIG. 1. Additional layers such as interlevel dielectric layers, metallization, and the like can be formed to complete fabrication of the device 200.

It is appreciated that variations in the blocks performed and the order in which they are performed can vary. For example, the inventors of the present invention appreciate that the first cleaning operation can be omitted and only the extended cleaning operation be performed in variations of the method 100. Additionally, as another example, the inventors of the present invention appreciate that the extended cleaning operation can be performed multiple times with varied cleaning solutions in order to substantially remove the dry etch residue. However, it is critical that the extended cleaning is done before the heavy source/drain ion implants.

Figure 3:
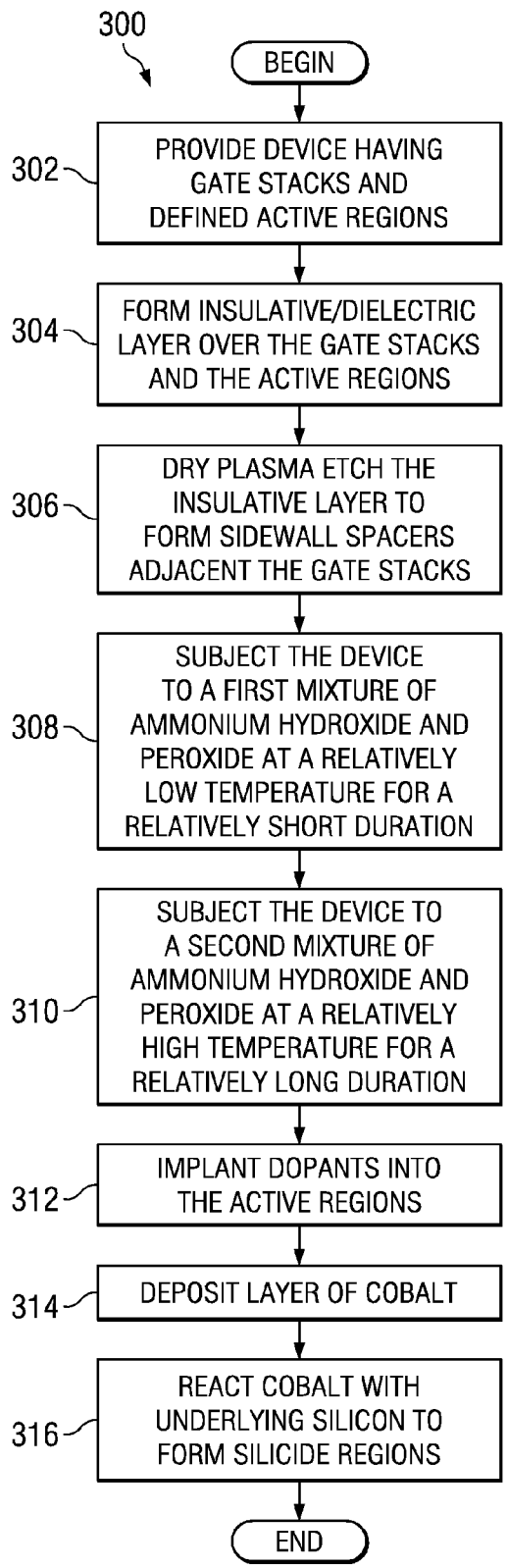
FIG. 3 is a flow diagram illustrating a method of fabricating a semiconductor device with substantially uniform cobalt silicide regions in accordance with an aspect of the present invention.

FIG. 3 is a flow diagram illustrating a method 300 of fabricating a semiconductor device with substantially uniform cobalt silicide regions in accordance with another aspect of the present invention. The method 300 substantially removes dry etch residue prior to depositing a cobalt layer by employing an extended cleaning operation with a mixture of ammonium hydroxide. As a result, formation of uniform cobalt silicide regions/contacts and reduced contact resistance can be obtained.

The method 300 begins at block 302 wherein a semiconductor device having gate stacks formed on and active regions defined in a semiconductor substrate is provided. The defined active regions have not yet been implanted with a selected dopant to operate as source drain regions. Additionally, the active regions may also be referred to as diffusion regions.

An insulative layer (e.g., silicon dioxide) is formed over the active regions and the gate stacks at block 304. Generally, the insulative layer is formed by depositing a dielectric material over the device. The insulative layer is dry plasma etched at block 306 to remove portions of the insulative layer and form sidewall spacers adjacent sidewalls of the gate stacks. It is appreciated that formation of the sidewall spacers can include depositing multiple layers of varied prior to dry etching the multiple layers. The dry plasma etch employs a chemical etchant that is selective to the materials comprising the insulative layer and an energy source to energize the chemical reactant to a plasma state wherein ions attack and etch exposed portions of the insulative layer by etching anisotropically. An undesired result of the dry etch plasma process employed to form the sidewall spacers is that dry etch residue from the reactant gas, target material, and volatile components can remain on surfaces of the semiconductor device.

The semiconductor device is subjected to a first mixture of ammonium hydroxide and peroxide at a relatively low temperature for a relatively short duration at block 308 to remove a portion of dry etch residue from surfaces of the semiconductor device. The relatively short duration corresponds to about 3.5 minutes to about 10 minutes and the relatively low temperature corresponds to about 25 to about 60 degrees Celsius. The mixture can be applied via an immersion bath and/or spray mechanism. The operation removes some, but not all, of the remaining dry etch residue. Subsequently, a suitable drying operation is performed to dry the device and wafer, such as, for example a spin dry.

Then, the semiconductor device is subjected to a second mixture of ammonium hydroxide and peroxide at a relatively high temperature for a relatively long duration at block 310 to remove remaining portions of the dry etch residue from surfaces of the semiconductor device. The relatively long duration corresponds to at least about 10 minutes and the relatively high temperature corresponds to at least about 60 degrees Celsius. The second mixture can be applied via an immersion bath and/or spray mechanism. The operation removes substantially all of the remaining dry etch residue. Subsequently, a suitable drying operation is performed to dry the device and wafer, such as, for example a spin dry.

Active regions are selective implanted with dopants at block 312. Other processes including native oxide removal via sputtering can also be performed before or after the active region implantation.

A layer of cobalt is deposited at block 314, typically by sputtering cobalt on the device. A cap layer, typically in thickness range of 10-30 nm, can optionally be formed on the cobalt layer in order to mitigate oxygen contamination of the cobalt. Cobalt silicide regions are then formed by performing one or more anneals that cause the cobalt to react with underlying silicon and form cobalt mon-silicide (CoSi) at block 316. The formed cobalt silicide regions are substantially uniform and provide suitable contact resistance for operation of the semiconductor device.

Figure 4:
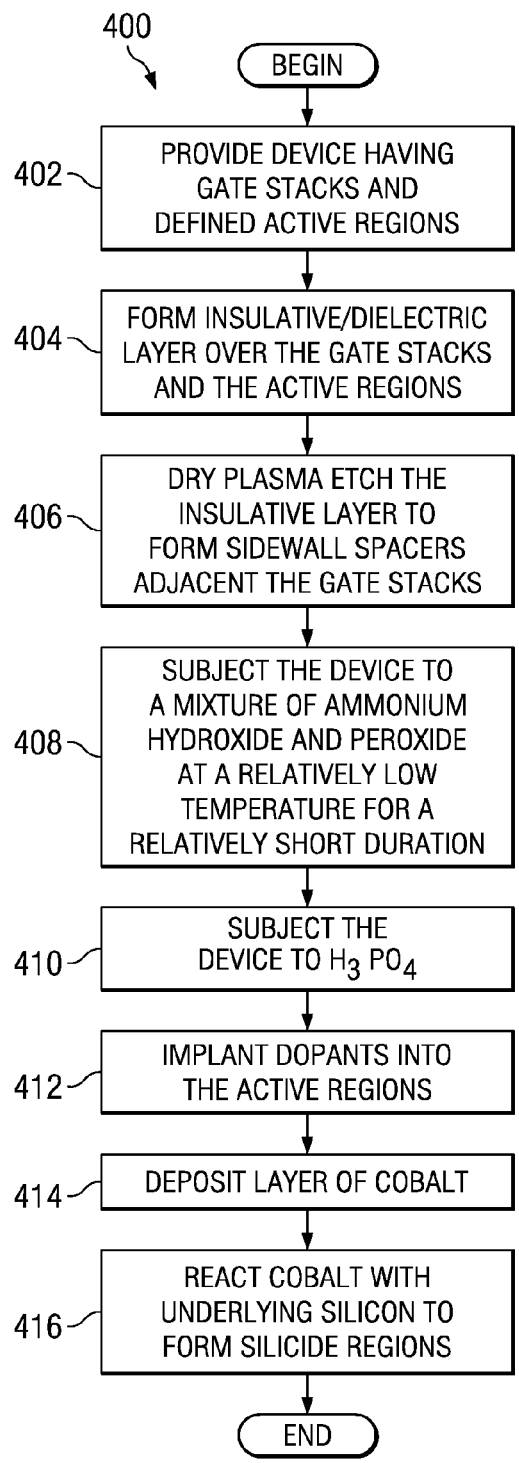
FIG. 4 is a flow diagram illustrating a method of fabricating a semiconductor device with substantially uniform cobalt silicide regions in accordance with an aspect of the present invention.

FIG. 4 is a flow diagram illustrating a method 400 of fabricating a semiconductor device with substantially uniform cobalt silicide regions in accordance with an aspect of the present invention. The method employs a cleaning solution comprised of $H_3PO_4$ instead of the ammonium hydroxide employed in the method 300 of FIG. 3. The method 400 substantially removes dry etch residue prior to depositing a cobalt layer, thereby facilitating formation of uniform cobalt silicide regions/contacts.

The method 400 begins at block 402 wherein a semiconductor device having gate stacks formed on and active regions defined in a semiconductor substrate is provided. The defined active regions have not yet been implanted with a selected dopant to operate as source drain regions. Additionally, the active regions may also be referred to as diffusion regions.

Continuing with the method 400, an insulative layer (e.g., silicon dioxide) is formed over the active regions and the gate stacks at block 404. The insulative layer is formed by depositing a suitable insulative material over the device. The insulative layer is dry plasma etched at block 406 to remove exposed portions of the insulative layer and form sidewall spacers adjacent sidewalls of the gate stacks. It is appreciated that formation of the sidewall spacers can include depositing multiple layers of varied prior to dry etching the multiple layers. The dry plasma etch employs a chemical etchant that is selective to the materials comprising the insulative layer and an energy source to energize the chemical reactant to a plasma state wherein ions attack and etch exposed portions of the insulative layer. An undesired result of the dry etch plasma process employed to form the sidewall spacers is that dry etch residue from the reactant gas, target material, and volatile components can remain on surfaces of the semiconductor device.

The semiconductor device is subjected to a mixture of ammonium hydroxide and peroxide at a relatively low temperature for a relatively short duration at block 408 to remove a portion of dry etch residue from surfaces of the semiconductor device. The relatively short duration corresponds to about 4.5 minutes to about 10 minutes and the relatively low temperature corresponds to about 25 to about 60 degrees Celsius. The mixture can be applied via an immersion bath and/or spray mechanism. The operation removes some, but not all, of the remaining dry etch residue. Subsequently, a suitable drying operation is performed to dry the device and wafer, such as, for example a spin dry.

Then, the semiconductor device is subjected to a cleaning solution comprised of $H_3PO_4$ at a relatively high temperature for a relatively long duration at block 410 to remove remaining portions of the dry etch residue from surfaces of the semiconductor device. The relatively long duration corresponds to at least about 10 minutes and the relatively high temperature corresponds to at least about 120 degrees Celsius. The cleaning solution can be applied via an immersion bath and/or spray mechanism. The operation removes substantially all of the remaining dry etch residue. Subsequently, a suitable drying operation is performed to dry the device and wafer, such as, for example a spin dry.

Active region are selective implanted with dopants at block 412. Other processes including native oxide removal via sputtering can also be performed before or after the active region implantation.

A layer of cobalt is deposited at block 414, typically by sputtering Cobalt on the device. A cap layer, typically in thickness range of 10-30 nm, can optionally be formed on the cobalt layer in order to mitigate oxygen contamination. Cobalt silicide regions are then formed by performing one or more anneals that cause the cobalt to react with underlying silicon and form cobalt silicide (CoSi, $CoSi_2$) at block 416. The formed cobalt silicide regions are substantially uniform and provide suitable contact resistance for operation of the semiconductor device.

While, for purposes of simplicity of explanation, the methodologies of FIGS. 1, 3 and 4 are depicted and described as executing serially, it is to be understood and appreciated that the present invention is not limited by the illustrated order, as some aspects could, in accordance with the present invention, occur in different orders and/or concurrently with other aspects from that depicted and described herein. Moreover, not all illustrated features may be required to implement a methodology in accordance with an aspect the present invention.

Although the invention has been shown and described with respect to a certain aspect or various aspects, it is obvious that equivalent alterations and modifications will occur to others skilled in the art upon the reading and understanding of this specification and the annexed drawings. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several aspects of the invention, such feature may be combined with one or more other features of the other aspects as may be desired and advantageous for any given or particular application. Furthermore, to the extent that the term "includes" is used in either the detailed description or the claims, such term is intended to be inclusive in a manner similar to the term "comprising."

What is claimed is:

1. A method of fabricating a semiconductor device comprising:
    forming a gate oxide layer on a semiconductor substrate;
    forming a polysilicon layer on the gate oxide layer;
    patterning the gate oxide layer and the polysilicon layer to form gate structures;
    forming offset spacers adjacent to gate stacks;
    performing an shallow region implant to form extension regions;
    depositing a dielectric layer and patterning the dielectric layer to form sidewall spacers adjacent to the gate stacks and the offset spacers via a dry etch plasma process that leaves dry etch residue;

performing a first cleaning operation that removes a portion of the dry etch residue;

performing an extended cleaning operation to substantially remove the dry etch residue after the first cleaning operation;

performing an active region deep implant to form active regions after performing the first cleaning operation and the extended cleaning operation;

performing an anneal operation to form the active regions;

performing a wet pre-clean operation to remove a portion of native oxide from a surface portion of the active regions;

performing a reduced sputter operation to substantially remove the native oxide that mitigates dislodging of sidewall materials from the sidewall spacers onto surfaces of the active regions;

forming a cobalt layer on the device by depositing cobaly;

forming a cap layer on the cobalt layer;

performing a first silicide anneal to initiate formation of cobalt mono-silicide regions, wherein the cobalt-silicide regions are substantially uniform;

removing the cap layer and the un-reacted cobalt; and performing a second silicide anneal to complete formation of the cobalt di-silicide regions.

2. The method of claim 1, wherein the extended cleaning operation is performed at a greater temperature than the first cleaning operation.

3. The method of claim 1, wherein the extended cleaning operation is performed for a longer duration than the first cleaning operation.

4. The method of claim 1, wherein the extended cleaning operation is performed at a greater temperature than the first cleaning operation and is performed for a longer duration than the first cleaning operation.

5. The method of claim 1, wherein performing the extended cleaning operation comprises subjecting the semiconductor device to a cleaning solution for a duration of at least 10 minutes and a temperature of at least 60 degrees Celsius.

6. The method of claim 5, wherein the cleaning solution comprises a mixture of ammonium hydroxide and peroxide.

7. The method of claim 5, wherein the cleaning solution comprises $H_3PO_4$.

8. The method of claim 1, wherein the reduced sputter operation is performed by sputtering Argon for a reduced time period to remove a relatively small amount of oxide material thereby substantially removing the native oxide.

9. The method of claim 8, wherein the small amount of oxide material removed is less than 30 Angstroms.

10. The method of fabricating a semiconductor device comprising:

depositing a dielectric layer and patterning the dielectric layer to form sidewall spacers adjacent to a gate stack via a dry etch plasma process that leaves dry etch residue;

performing a first cleaning operation that removes a portion of the dry etch residue;

performing an extended cleaning operation to substantially remove the dry etch residue after the first cleaning operation;

performing an active region deep implant to form active regions after performing the first cleaning operation and the extended cleaning operation.

11. The method of claim 10, wherein the extended cleaning operation is performed at a greater temperature than the first cleaning operation.

12. A method of claim 10, wherein performing the extended cleaning operation comprises subjecting the semiconductor device to a cleaning solution for a duration of at least 10 minutes and a temperature of at least 60 degrees Celsius.

13. The method of claim 12, wherein the cleaning solution comprises a mixture of ammonium hydroxide and peroxide.

14. The method of claim 12, wherein the cleaning solution comprises $H_3PO_4$.

* * * * *